(12) United States Patent
Chuang

(10) Patent No.: US 12,424,505 B2
(45) Date of Patent: Sep. 23, 2025

(54) WAFER WARPAGE ADJUSTMENT STRUCTURE AND METHOD FOR MANUFACTURING THE SAME

(71) Applicant: CHANGXIN MEMORY TECHNOLOGIES, INC., Hefei (CN)

(72) Inventor: Ling-Yi Chuang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 445 days.

(21) Appl. No.: 18/168,633

(22) Filed: Feb. 14, 2023

(65) Prior Publication Data
US 2023/0343667 A1  Oct. 26, 2023

(30) Foreign Application Priority Data
Apr. 26, 2022  (CN) .......... 202210449165.1

(51) Int. Cl.
*H01L 23/31* (2006.01)
*H01L 21/56* (2006.01)
*H01L 23/29* (2006.01)

(52) U.S. Cl.
CPC .......... *H01L 23/3171* (2013.01); *H01L 21/56* (2013.01); *H01L 23/291* (2013.01); *H01L 23/3192* (2013.01)

(58) Field of Classification Search
CPC ... H01L 23/3171; H01L 21/56; H01L 23/291; H01L 23/3192; H01L 23/562
USPC .......................................... 257/618
See application file for complete search history.

(56) References Cited

U.S. PATENT DOCUMENTS

2017/0047294 A1   2/2017  Chang et al.
2021/0296282 A1*  9/2021  Gao .............. H01L 24/08

FOREIGN PATENT DOCUMENTS

CN    106449525 A    2/2017

\* cited by examiner

*Primary Examiner* — Quoc D Hoang
(74) *Attorney, Agent, or Firm* — SYNCODA LLC; Feng Ma

(57) ABSTRACT

A wafer warpage adjustment structure is provided. The wafer warpage adjustment structure includes a wafer, a first dielectric layer, and a second dielectric layer. Each of the first and second dielectric layers includes at least a first area or a second area, and other areas other than at least the first area or the second area. The first area covers a portion of the wafer protruded in a direction perpendicular to a surface of the wafer and extending from the wafer to the dielectric layer, and the second area covers a portion of the wafer recessed in the direction. CTE of a material of the first area is greater than CTE of a material of the wafer, and CTE of a material of the second area is less than CTE of the material of the wafer. A method for manufacturing the same is also provided.

20 Claims, 5 Drawing Sheets

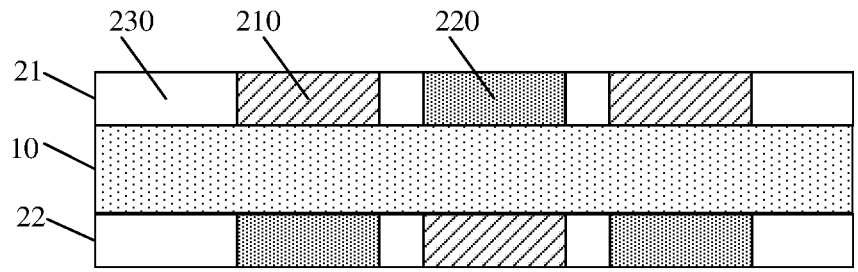

FIG. 3

| 401 |
|---|
| A wafer is provided, the wafer includes a lower surface, an upper surface arranged opposite to the lower surface and configured to form a semiconductor device, and a warpage area |

| 402 |
|---|
| A first dielectric layer is formed on the upper surface of the wafer, a second dielectric layer is formed on the lower surface of the wafer. Here each of the first dielectric layer and the second dielectric layer includes at least a first area or a second area, and further includes other areas other than at least the first area or the second area. The first area covers a protruded portion of the warpage area of the wafer which is protruded in a direction perpendicular to the surface of the wafer and extending from the wafer to the dielectric layer, and the second area covers a recessed portion of the warpage area of the wafer which is recessed in the direction perpendicular to the surface of the wafer and extending from the wafer to the dielectric layer. CTE of a material of the first area is greater than CTE of a material of the wafer, and CTE of a material of the second area is less than CTE of the material of the wafer |

FIG. 4

WAFER WARPAGE ADJUSTMENT STRUCTURE AND METHOD FOR MANUFACTURING THE SAME

CROSS-REFERENCE TO RELATED APPLICATIONS

This application claims priority to Chinese Patent Application No. 202210449165.1, filed on Apr. 26, 2022 and entitled "WAFER WARPAGE ADJUSTMENT STRUCTURE AND METHOD FOR MANUFACTURING THE SAME", the contents of which are hereby incorporated by reference in its entirety.

BACKGROUND

With the size of a wafer increases or the thickness of the wafer decreases, warpage occurs during manufacturing of the wafer. Due to difference between Coefficient of Thermal Expansion (CTE) of components forming a chip or a semiconductor package, warpage occurs when the chip is manufactured on the wafer or when the manufactured chip is packaged. Warpage represents undesired bending of a semiconductor chip or semiconductor package.

SUMMARY

The disclosure relates to the technical field of semiconductor manufacturing processes, and in particular to a wafer warpage adjustment structure and a method for manufacturing the same.

In view of this, embodiments of the disclosure provide a wafer warpage adjustment structure and a method for manufacturing the same.

According to a first aspect of the embodiments of the disclosure, there is provided a wafer warpage adjustment structure, including a wafer, a first dielectric layer and a second dielectric layer.

The wafer includes a lower surface, and an upper surface arranged opposite to the lower surface and configured to form a semiconductor device.

The first dielectric layer is located on the upper surface of the wafer.

The second dielectric layer is located on the lower surface of the wafer.

Here each of the first dielectric layer and the second dielectric layer includes at least a first area or a second area, and further includes other areas other than at least the first area or the second area.

The first area covers a protruded portion of the wafer which is protruded under an independent state in a direction perpendicular to the surface of the wafer and extending from the wafer to the dielectric layer, and the second area covers a recessed portion of the wafer which is recessed under an independent state in the direction perpendicular to the surface of the wafer and extending from the wafer to the dielectric layer.

CTE of a material of the first area is greater than CTE of a material of the wafer, and CTE of a material of the second area is less than CTE of the material of the wafer.

In some embodiments, the material of the first area of each of the first dielectric layer and the second dielectric layer may include silicon nitride (SiN) or silicon carbide (SiC).

The material of the second area of each of the first dielectric layer and the second dielectric layer may include quartz.

In some embodiments, CTE of the material of the first area of each of the first dielectric layer and the second dielectric layer may be greater than CTE of a material of the other area of each of the first dielectric layer and the second dielectric layer.

CTE of the material of the second area of each of the first dielectric layer and the second dielectric layer may be less than CTE of the material of the other area of each of the first dielectric layer and the second dielectric layer.

In some embodiments, thickness of the first area of each of the first dielectric layer and the second dielectric layer may be equal to or greater than thickness of the other area of each of the first dielectric layer and the second dielectric layer.

In some embodiments, the thickness of the first area of each of the first dielectric layer and the second dielectric layer may be 1 to 4 times the thickness of the other area of each of the first dielectric layer and the second dielectric layer.

In some embodiments, dielectric layer of the first area may include multiple dielectric layers, and in the direction perpendicular to the surface of the wafer and extending from the wafer to the dielectric layer, CTE of a material of each of the dielectric layers of the first area may decrease stepwise.

In some embodiments, dielectric layer of the second area may include multiple dielectric layers, and in the direction perpendicular to the surface of the wafer and extending from the wafer to the dielectric layer, CTE of a material of each of the dielectric layers of the second area may increase stepwise.

In some embodiments, in a direction along which curvature of a curve corresponding to the protruded portion decreases, CTE of the material of the first area of each of the dielectric layers may decrease stepwise.

In some embodiments, in a direction along which curvature of a curve corresponding to the recessed portion decreases, CTE of the material of the second area of each of the dielectric layers may increase stepwise.

According to a second aspect of the embodiments of the disclosure, there is provided a method for manufacturing a wafer warpage adjustment structure, including the following operations.

A wafer is provided, the wafer includes a lower surface, an upper surface arranged opposite to the lower surface and configured to form a semiconductor device, and a warpage area.

A first dielectric layer is formed on the upper surface of the wafer.

A second dielectric layer is formed on the lower surface of the wafer.

Here each of the first dielectric layer and the second dielectric layer includes at least a first area or a second area, and further includes other areas other than at least the first area or the second area.

The first area covers a protruded portion of the warpage area of the wafer which is protruded in a direction perpendicular to the surface of the wafer and extending from the wafer to the dielectric layer, and the second area covers a recessed portion of the warpage area of the wafer which is recessed in the direction perpendicular to the surface of the wafer and extending from the wafer to the dielectric layer.

CTE of a material of the first area is greater than CTE of a material of the wafer, and CTE of a material of the second area is less than CTE of the material of the wafer.

In some embodiments, the material of the first area of each of the first dielectric layer and the second dielectric layer may include SiN or SiC.

The material of the second area of each of the first dielectric layer and the second dielectric layer may include quartz.

In some embodiments, CTE of the material of the first area of each of the first dielectric layer and the second dielectric layer may be greater than CTE of a material of the other area of each of the first dielectric layer and the second dielectric layer.

CTE of the material of the second area of each of the first dielectric layer and the second dielectric layer may be less than CTE of the material of the other area of each of the first dielectric layer and the second dielectric layer.

In some embodiments, the operation of forming the first dielectric layer on the upper surface of the wafer, and the operation of forming the second dielectric layer on the lower surface of the wafer may include the following operations.

A first dielectric layer pre-layer is formed on the upper surface of the wafer.

A second dielectric layer pre-layer is formed on the lower surface of the wafer.

At least one of operations below is performed.

A portion of each of the first dielectric layer pre-layer and the second dielectric layer pre-layer in the first area is etched, to form a first groove, and the first groove is filled with a first material of which CTE is greater than CTE of the material of the wafer.

Or, a portion of each of the first dielectric layer pre-layer and the second dielectric layer pre-layer in the second area is etched, to form a second groove, and the second groove is filled with a second material of which CTE is less than CTE of the material of the wafer.

In some embodiments, thickness of the first area of each of the first dielectric layer and the second dielectric layer may be equal to or greater than thickness of the other area of each of the first dielectric layer and the second dielectric layer.

In some embodiments, the thickness of the first area of each of the first dielectric layer and the second dielectric layer may be 1 to 4 times the thickness of the other area of each of the first dielectric layer and the second dielectric layer.

In some embodiments, dielectric layer of the first area may include multiple dielectric layers, and in the direction perpendicular to the surface of the wafer and extending from the wafer to the dielectric layer, CTE of a material of each of the dielectric layers of the first area may decrease stepwise.

In some embodiments, dielectric layer of the second area may include multiple dielectric layers, and in the direction perpendicular to the surface of the wafer and extending from the wafer to the dielectric layer, CTE of a material of each of the dielectric layers of the second area may increase stepwise.

In some embodiments, in a direction along which curvature of a curve corresponding to the protruded portion decreases, CTE of the material of the first area of each of the dielectric layers may decrease stepwise.

In some embodiments, in a direction along which curvature of a curve corresponding to the recessed portion decreases, CTE of the material of the second area of each of the dielectric layers may increase stepwise.

In some embodiments, the warpage area of the wafer may have a saddle-like shape or a wavy shape.

In the embodiments of the disclosure, by means of forming a dielectric layer on each of the upper surface and the lower surface of the wafer, and controlling CTE of a protruded portion of the dielectric layer which is protruded in a direction extending from the wafer to the dielectric layer to be greater than CTE of the wafer, and controlling CTE of a recessed portion of the dielectric layer which is recessed in the direction extending from the wafer to the dielectric layer to be less than CTE of the wafer, materials with different CTEs may be formed for local areas.

BRIEF DESCRIPTION OF THE DRAWINGS

In order to explain technical solutions in the embodiments of the disclosure or conventional technologies more clearly, the drawings required to be used in the embodiments will be briefly described below. It is apparent that the drawings in the following descriptions are merely some embodiments of the disclosure. Other drawings may be obtained by those of ordinary skill in the art according to these drawings without paying any creative work.

FIG. 3 is a schematic structural diagram of a wafer warpage adjustment structure after leveling according to an embodiment of the disclosure.

FIG. 4 is a schematic flowchart of a method for manufacturing a wafer warpage adjustment structure according to an embodiment of the disclosure.

EXPLANATION OF REFERENCE NUMERALS

Figure 1:
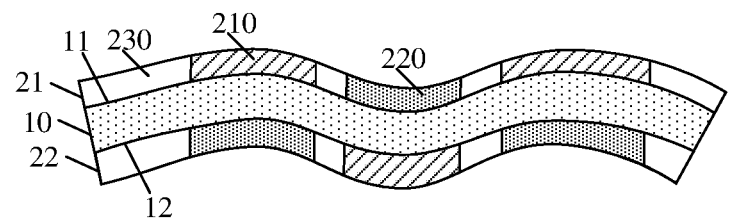
FIG. 1 is a schematic structural diagram of a wafer warpage adjustment structure according to an embodiment of the disclosure.

10—Wafer; 11—Upper surface; 12—Lower surface;
21—First dielectric layer; 22—Second dielectric layer; 21'—First dielectric layer pre-layer; 22'—Second dielectric layer pre-layer; 201—First groove; 202—Second groove;
210—First area; 211—First sub-area at first layer; 212—First sub-area at second layer; 213—$1^{st}$ first sub-area; 214—$2^{nd}$ first sub-area; 215—$3^{rd}$ first sub-area;
220—Second area; 221—Second sub-area at first layer; 222—Second sub-area at second layer; 223—$1^{st}$ second sub-area; 224—$2^{nd}$ second sub-area; 225—$3^{rd}$ second sub-area;
230—Other area;
30—Mask layer; 301—Patterned mask layer.

DETAILED DESCRIPTION

Exemplary embodiments disclosed in the disclosure will be described in more detail below with reference to the drawings. Although the exemplary embodiments of the disclosure are shown in the drawings, it should be understood that the disclosure may be implemented in various forms and should not be limited by specific embodiments described here. Instead, these embodiments are provided to understand the disclosure more thoroughly, and to fully convey a scope disclosed in the disclosure to those skilled in the art.

In the following descriptions, a lot of specific details are given to provide more thorough understanding of the disclosure. However, it is apparent to those skilled in the art that the disclosure may be implemented without one or more of these details. In other examples, in order to avoid confusion with the disclosure, some technical features well-known in the art are not described. That is, all the features of actual embodiments are not described here, and well-known functions and structures are not described in detail.

In the drawings, sizes of a layer, an area, and an element and their relative sizes may be exaggerated for clarity. The same reference numeral represents the same element throughout the disclosure.

It should be understood that when an element or a layer is referred to as being "above", "adjacent to", "connected to" or "coupled to" other elements or layers, it may be directly above, adjacent to, connected to or coupled to the other elements or layers, or an intermediate element or layer may exist. In contrast, when an element is referred to as being "directly above", "directly adjacent to", "directly connected to" or "directly coupled to" other elements or layers, an intermediate element or layer does not exist. It should be understood that although terms "first", "second", "third" or the like may be used to describe various elements, components, areas, layers and/or portion, these elements, components, areas, layers and/or portions should not be limited by these terms. These terms are only intended to distinguish an element, component, area, layer or portion from another element, component, area, layer or portion. Therefore, without departing from teaching of the disclosure, a first element, component, area, layer or portion as discussed below may be represented as a second element, component, area, layer or portion. While a second element, component, area, layer or portion is discussed, it does not mean that a first element, component, area, layer or portion necessarily exists in the disclosure.

Spatial relationship terms, such as "under", "below", "lower", "underneath", "above", "upper" or the like, may be used here for convenient descriptions, so that a relationship between an element or feature shown in the drawings and other elements or features is described. It should be understood that in addition to orientations shown in the drawings, the spatial relationship terms are intended to further include different orientations of a device in use and operation. For example, when a device in the drawings is turned over, then elements or the features described as "below" or "underneath" or "under" other elements may be oriented "above" the other elements or features. Therefore, exemplary terms "below" and "under" may include two orientations of "up" and "down". The device may be oriented otherwise (rotated by 90 degrees or in other orientations) and spatial descriptions used here are interpreted accordingly.

A purpose of terms used here is only to describe specific embodiments and not used as limitation to the disclosure. Singular forms of "a", "an" and "said/the" are also intended to include plural forms when they are used here, unless otherwise indicated in the context clearly. It should also be understood that terms "composition" and/or "include" determine existence of the described features, integers, steps, operations, elements and/or components when they are used in the description, but do not exclude existence or addition of one or more other features, integers, steps, operations, elements, components and/or groups. A term "and/or" includes any and all combinations of related listed items when it is used here.

In order to understand the disclosure thoroughly, detailed operations and detailed structures are presented in the following descriptions, to explain the technical solutions of the disclosure. Preferred embodiments of the disclosure are described in detail below, however, the disclosure may also have other implementations in addition to these detailed descriptions.

During manufacturing of a wafer, an irregular warpage deformation may be pre-existed in a silicon slice for manufacturing the wafer, or temperature of the manufactured wafer is reduced from a high temperature of about 400° C. to room temperature of 25° C., and in this process, CTE of an internal dielectric material (for example, Si and $SiO_2$) mismatches, resulting in warpage deformation of the wafer, which is not conducive to production process of a chip.

In some embodiments, a method of adding a plated dielectric layer on the wafer is mainly used for leveling. However, the method may only aim at a whole area, and may hardly achieve "local" adjustment. Generally, the same wafer chip remains the same or each photomask is the same, and the formed dielectric layer is made of the same material, therefore it is difficult to ensure that the wafer is completely leveled. Furthermore, the method may not level a wafer with a complicated shape (for example, a saddle-like shape or a wavy shape).

Based on this, an embodiment of the disclosure provides a wafer warpage adjustment structure. FIG. 1 is a schematic structural diagram of a wafer warpage adjustment structure according to an embodiment of the disclosure.

Referring to FIG. 1, the wafer warpage adjustment structure includes a wafer 10, a first dielectric layer 21 and a second dielectric layer 22.

The wafer 10 includes a lower surface 12, and an upper surface 11 arranged opposite to the lower surface 12 and configured to form a semiconductor device.

The first dielectric layer 21 is located on the upper surface 11 of the wafer 10.

The second dielectric layer 22 is located on the lower surface 12 of the wafer 10.

Here each of the first dielectric layer 21 and the second dielectric layer 22 includes at least a first area 210 or a second area 220, and further includes other areas 230 other than at least the first area 210 or the second area 220.

The first area 210 covers a protruded portion of the wafer 10 which is protruded under an independent state in a direction perpendicular to the surface of the wafer 10 and extending from the wafer 10 to the dielectric layer, and the second area 220 covers a recessed portion of the wafer 10 which is recessed under an independent state in the direction perpendicular to the surface of the wafer 10 and extending from the wafer 10 to the dielectric layer.

CTE of a material of the first area 210 is greater than CTE of a material of the wafer 10, and CTE of a material of the second area 220 is less than CTE of the material of the wafer 10.

In the embodiments of the disclosure, materials with different CTEs may be formed for local areas, to improve warpage degree of the wafer, a process of such forming is simple, flexible, fast, and applicable to any complicated warpage shape, and applicable to stacked wafers of different System on Wafers (SoWs), thereby achieving integration of multiple SoWs.

In an embodiment, the material of the first area 210 of each of the first dielectric layer 21 and the second dielectric layer 22 includes SiN or SiC. The material of the second area 220 of each of the first dielectric layer 21 and the second dielectric layer 22 includes quartz.

In an embodiment, CTE of the material of the first area 210 of each of the first dielectric layer 21 and the second dielectric layer 22 is greater than CTE of a material of the other area 230 of each of the first dielectric layer 21 and the second dielectric layer 22.

CTE of the material of the second area 220 of each of the first dielectric layer 21 and the second dielectric layer 22 is less than CTE of the material of the other area 230 of each of the first dielectric layer 21 and the second dielectric layer 22.

CTE of each of the first dielectric layer and the second dielectric layer at an externally-protruded area is greater than CTE of each of the first dielectric layer and the second dielectric layer at other areas; and CTE of each of the first dielectric layer and the second dielectric layer at an internally-recessed area is less than CTE at other areas. In this way, CTE of other areas is included between CTE of the first area and CTE of the second area, and other areas may also play a role of improving warpage degree of the wafer, such that the first dielectric layer and the second dielectric layer may play a role of improving warpage degree of the wafer better.

Specifically, the material of the wafer is silicon (Si), and CTE of Si is $2.7 \times 10^{-6}/°$ C. The material of the other area of each of the first dielectric layer and the second dielectric layer other than at least the first area or the second area is silicon dioxide ($SiO_2$), and CTE of $SiO_2$ is $0.55 \times 10^{-6}/°$ C. CTE of SiN is $3.2 \times 10^{-6}/°$ C.; CTE of SiC is $2.8 \times 10^{-6}/°$ C.; and CTE of quartz is $0.33 \times 10^{-6}/°$ C. It may be seen from the above data that CTE of SiN or SiC is greater than CTE of Si and CTE of $SiO_2$, and CTE of quartz is less than CTE of Si and CTE of $SiO_2$. That is to say, CTE of the material of the first area is greater than CTE of the material of the wafer and CTE of the material of the other area of each of the first dielectric layer and the second dielectric layer other than at least the first area or the second area, and CTE of the material of the second area is less than CTE of the material of the wafer and CTE of the material of the other area of each of the first dielectric layer and the second dielectric layer other than at least the first area or the second area.

Figure 2A:
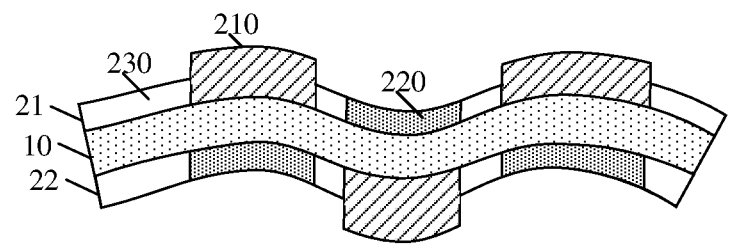
FIG. 2A to FIG. 2E are other examples of a wafer warpage adjustment structure according to an embodiment of the disclosure.

In an embodiment, as shown in FIG. 2A, thickness of the first area 210 of each of the first dielectric layer 21 and the second dielectric layer 22 is equal to or greater than thickness of the other area 230 of each of the first dielectric layer 21 and the second dielectric layer 22. Thickness of each of the first dielectric layer and the second dielectric layer at the first area is equal to or greater than thickness of each of the first dielectric layer and the second dielectric layer at other areas. In this way, each of the first dielectric layer and the second dielectric layer has a better heat expansion and cold contraction effect at this area, thereby better improving the problem of warpage of the wafer.

Specifically, in an embodiment, the thickness of the first area 210 of each of the first dielectric layer 21 and the second dielectric layer 22 is 1 to 4 times the thickness of the other area 230 of each of the first dielectric layer 21 and the second dielectric layer 22. Within the thickness range, each of the first dielectric layer and the second dielectric layer has a best effect of improving warpage degree of the wafer, to avoid no effect of improving warpage degree of the wafer due to too small thickness, and avoid excessively correcting the wafer and resulting in the wafer bending in a reverse direction, due to too large thickness.

In an embodiment, dielectric layer of the first area 210 includes multiple dielectric layers, and in the direction perpendicular to the surface of the wafer 10 and extending from the wafer 10 to the dielectric layer, CTE of a material of each of the dielectric layers of the first area 210 decreases stepwise.

In this way, a dielectric layer of the first area closest to the wafer has a maximum CTE, and has a larger CTE difference with respect to the wafer, such that warpage degree of the wafer may be better improved. Furthermore, since CTE of each of the dielectric layers away from the wafer decreases progressively, warpage degree of the wafer may be better adjusted, to avoid excessive correction.

Figure 2B:
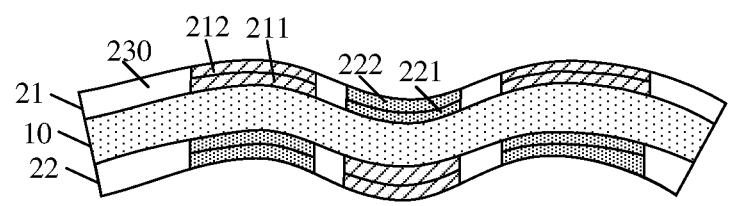

Specifically, as shown in FIG. 2B, in the direction perpendicular to the surface of the wafer 10 and extending from the wafer 10 to the dielectric layer, the first area 210 includes a first sub-area 211 at a first layer and a first sub-area 212 at a second layer. CTEs of materials of the first sub-area 211 at the first layer and the first sub-area 212 at the second layer decrease stepwise.

Specifically, in some embodiments, CTEs of the first sub-area 211 at the first layer and the first sub-area 212 at the second layer may decrease stepwise by using materials with different CTEs. In some other embodiments, the first sub-area 211 at the first layer and the first sub-area 212 at the second layer may use the same material, but ions with different concentrations may be doped in each layer, so that CTEs of the first sub-area 211 at the first layer and the first sub-area 212 at the second layer decrease stepwise.

In an embodiment, dielectric layer of the second area 220 includes multiple dielectric layers, and in the direction perpendicular to the surface of the wafer 10 and extending from the wafer 10 to the dielectric layer, CTE of a material of each of the dielectric layers of the second area 220 increases stepwise.

In this way, a dielectric layer of the second area closest to the wafer has a minimum CTE, and has a larger CTE difference with respect to the wafer, such that warpage degree of the wafer may be better improved. Furthermore, since CTE of each of the dielectric layers away from the wafer increases progressively, warpage degree of the wafer may be better adjusted, to avoid excessive correction.

Specifically, as shown in FIG. 2B, in the direction perpendicular to the surface of the wafer 10 and extending from the wafer 10 to the dielectric layer, the second area 220 includes a second sub-area 221 at a first layer and a second sub-area 222 at a second layer. CTEs of materials of the second sub-area 221 at the first layer and the second sub-area 222 at the second layer increase stepwise.

Specifically, in some embodiments, CTEs of the second sub-area 221 at the first layer and the second sub-area 222 at the second layer may increase stepwise by using materials with different CTEs. In some other embodiments, the second sub-area 221 at the first layer and the second sub-area 222 at the second layer may use the same material, but ions with different concentrations may be doped in each layer, so that CTEs of the second sub-area 221 at the first layer and the second sub-area 222 at the second layer increase stepwise.

In some embodiments, the dielectric layer of the first area of the wafer warpage adjustment structure includes multiple dielectric layers, and the dielectric layer of the second area of the wafer warpage adjustment structure includes one dielectric layer. In some other embodiments, the dielectric layer of the first area includes one dielectric layer, and the dielectric layer of the second area includes multiple dielectric layers. In some other embodiments, as shown in FIG. 2B, the dielectric layer of the first area includes multiple dielectric layers, and the dielectric layer of the second area includes multiple dielectric layers.

In an embodiment, in a direction along which curvature of a curve corresponding to the protruded portion decreases, CTE of the material of the first area 210 of each of the dielectric layers decreases stepwise.

Figure 2C:
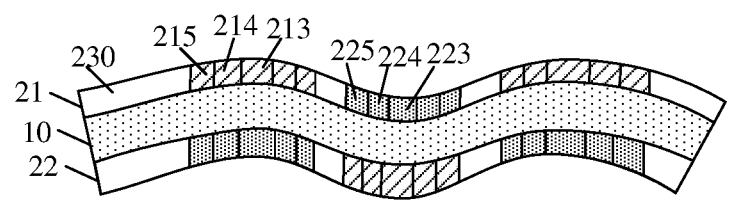

Specifically, as shown in FIG. 2C, in the direction along which curvature of a curve corresponding to the protruded portion decreases, the first area 210 includes a 1st first sub-area 213, a $2^{nd}$ first sub-area 214 and a $3^{rd}$ first sub-area 215. CTEs of materials of the $1^{st}$ first sub-area 213, the $2^{nd}$ first sub-area 214 and the $3^{rd}$ first sub-area 215 decrease stepwise.

Because a place with a maximum curvature is more difficult to be corrected, the above problem may be effectively solved by using a dielectric layer with a largest CTE difference with respect to the wafer. Furthermore, CTEs of other dielectric layers vary with the curvature, such that warpage of the wafer may be accurately adjusted.

Specifically, in some embodiments, CTEs of the $1^{st}$ first sub-area 213, the $2^{nd}$ first sub-area 214 and the $3^{rd}$ first sub-area 215 may decrease stepwise by using materials with different CTEs. In some other embodiments, the $1^{st}$ first sub-area 213, the $2^{nd}$ first sub-area 214 and the $3^{rd}$ first sub-area 215 may use the same material, but ions with different concentrations may be doped in each area, so that CTEs of the $1^{st}$ first sub-area 213, the $2^{nd}$ first sub-area 214 and the $3^{rd}$ first sub-area 215 decrease stepwise.

In an embodiment, in a direction along which curvature of a curve corresponding to the recessed portion decreases, CTE of the material of the second area 220 of each of the dielectric layers increases stepwise.

Specifically, as shown in FIG. 2C, in the direction along which curvature of a curve corresponding to the recessed portion decreases, the second area 220 includes a $1^{st}$ second sub-area 223, a $2^{nd}$ second sub-area 224 and a $3^{rd}$ second sub-area 225. CTEs of materials of the $1^{st}$ second sub-area 223, the $2^{nd}$ second sub-area 224 and the $3^{rd}$ second sub-area 225 increase stepwise.

Because a place with a maximum curvature is more difficult to be corrected, the above problem may be effectively solved by using a dielectric layer with a largest CTE difference with respect to the wafer. Furthermore, CTEs of other dielectric layers vary with the curvature, such that warpage of the wafer may be accurately adjusted.

Specifically, in some embodiments, CTEs of the $1^{st}$ second sub-area 223, the $2^{nd}$ second sub-area 224 and the $3^{rd}$ second sub-area 225 may increase stepwise by using materials with different CTEs. In some other embodiments, the $1^{st}$ second sub-area 223, the $2^{nd}$ second sub-area 224 and the $3^{rd}$ second sub-area 225 may use the same material, but ions with different concentrations may be doped in each area, so that CTEs of the $1^{st}$ second sub-area 223, the $2^{nd}$ second sub-area 224 and the $3^{rd}$ second sub-area 225 increase stepwise.

In some embodiments, in the direction along which curvature of a curve corresponding to the protruded portion decreases, CTE of the material of the first area decreases stepwise, and in the direction along which curvature of a curve corresponding to the recessed portion decreases, CTE of the material of the second area keeps unchanged. In some other embodiments, in the direction along which curvature of a curve corresponding to the protruded portion decreases, CTE of the material of the first area keeps unchanged, and in the direction along which curvature of a curve corresponding to the recessed portion decreases, CTE of the material of the second area increases stepwise. In some other embodiments, as shown in FIG. 3C, in the direction along which curvature of a curve corresponding to the protruded portion decreases, CTE of the material of the first area decreases stepwise, and in the direction along which curvature of a curve corresponding to the recessed portion decreases, CTE of the material of the second area increases stepwise.

In an embodiment, a bending shape of the wafer may be a saddle-like shape or a wavy shape.

Specifically, in some embodiments, as shown in FIG. 1 to FIG. 2C, the bending shape of the wafer is a wavy shape. In some other embodiments, as shown in FIG. 2D and FIG. 2E, the bending shape of the wafer is a saddle-like shape. As shown in FIG. 2D, each of the first dielectric layer 21 and the second dielectric layer 22 only includes the first area 210. As shown in FIG. 2E, each of the first dielectric layer 21 and the second dielectric layer 22 only includes the second area 220.

In the embodiments of the disclosure, after materials with different CTEs are formed for local areas of a bent wafer, the wafer may be leveled, such that the wafer may achieve a shape shown in FIG. 3 finally.

An embodiment of the disclosure further provides a method for manufacturing a wafer warpage adjustment structure, referring to FIG. 4 for details. As shown in the figure, the method includes the following operations.

In operation S401, a wafer is provided, the wafer includes a lower surface, an upper surface arranged opposite to the lower surface and configured to form a semiconductor device, and a warpage area.

In operation S402, a first dielectric layer is formed on the upper surface of the wafer, a second dielectric layer is formed on the lower surface of the wafer. Here each of the first dielectric layer and the second dielectric layer includes at least a first area or a second area, and further includes other areas other than at least the first area or the second area. The first area covers a protruded portion of the warpage area of the wafer which is protruded in a direction perpendicular to the surface of the wafer and extending from the wafer to the dielectric layer, and the second area covers a recessed portion of the warpage area of the wafer which is recessed in the direction perpendicular to the surface of the wafer and extending from the wafer to the dielectric layer. CTE of a material of the first area is greater than CTE of a material of the wafer, and CTE of a material of the second area is less than CTE of the material of the wafer.

The method for manufacturing a wafer warpage adjustment structure provided in the embodiments of the disclosure is further described in detail below with reference to specific embodiments.

FIG. 5A to FIG. 5F are schematic structural diagrams of a wafer warpage adjustment structure during its manufacturing according to an embodiment of the disclosure.

Figure 5A:
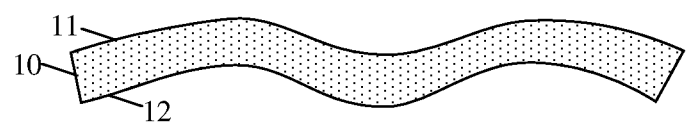
FIG. 5A to FIG. 5F are schematic structural diagrams of a wafer warpage adjustment structure during its manufacturing according to an embodiment of the disclosure.

First, referring to FIG. 5A, operation S401 is executed. A wafer 10 is provided, the wafer 10 includes a lower surface 12, an upper surface 11 arranged opposite to the lower surface 12 and configured to form a semiconductor device, and a warpage area.

Next, referring to FIG. 5B to FIG. 5F, operation S402 is executed. A first dielectric layer 21 is formed on the upper surface 11 of the wafer 10, a second dielectric layer 22 is formed on the lower surface 12 of the wafer 10. Here each of the first dielectric layer 21 and the second dielectric layer 22 includes at least a first area 210 or a second area 220, and further includes other areas 230 other than at least the first area 210 or the second area 220. The first area 210 covers a protruded portion of the warpage area of the wafer 10 which is protruded in a direction perpendicular to the surface of the wafer 10 and extending from the wafer 10 to the dielectric layer, and the second area 220 covers a recessed portion of the warpage area of the wafer 10 which is recessed in the direction perpendicular to the surface of the wafer 10 and extending from the wafer 10 to the dielectric layer. CTE of a material of the first area 210 is greater than CTE of a material of the wafer 10, and CTE of a material of the second area 220 is less than CTE of the material of the wafer 10.

In an embodiment, the operation of forming the first dielectric layer 21 on the upper surface 11 of the wafer 10, and the operation of forming the second dielectric layer 22 on the lower surface 12 of the wafer 10 include the following operations.

A first dielectric layer pre-layer 21' is formed on the upper surface 11 of the wafer 10.

A second dielectric layer pre-layer 22' is formed on the lower surface 12 of the wafer 10.

At least one of operations below is performed.

A portion of each of the first dielectric layer pre-layer 21' and the second dielectric layer pre-layer 22' in the first area is etched, to form a first groove 201, and the first groove 201 is filled with a first material of which CTE is greater than CTE of the material of the wafer 10.

Or, a portion of each of the first dielectric layer pre-layer 21' and the second dielectric layer pre-layer 22' in the second area is etched, to form a second groove 202, and the second groove 202 is filled with a second material of which CTE is less than CTE of the material of the wafer 10.

Figure 5B:
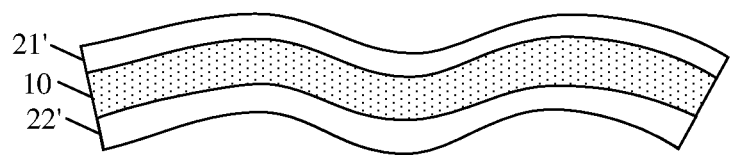

Specifically, first, referring to FIG. 5B, the first dielectric layer pre-layer 21' is formed on the upper surface 11 of the wafer 10, and the second dielectric layer pre-layer 22' is formed on the lower surface 12 of the wafer 10.

In actual operations, the first dielectric layer pre-layer 21' and the second dielectric layer pre-layer 22' may be formed by using one or more thin film deposition processes. Specifically, the deposition processes include, but are not limited to a Chemical Vapor Deposition (CVD) process, a Plasma Enhanced Chemical Vapor Deposition (PECVD) process, an Atomic Layer Deposition (ALD) process, or a combination thereof.

Figure 5C:
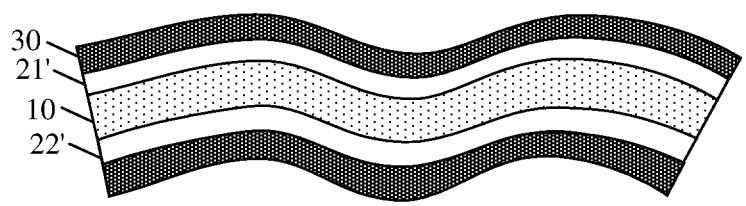
Figure 5D:
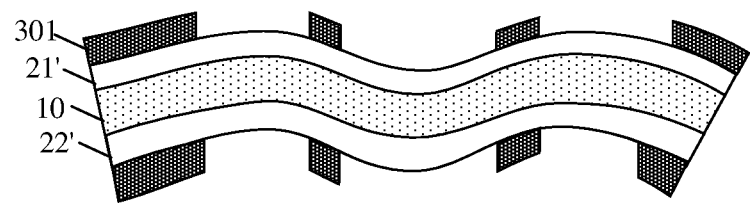
Figure 5E:
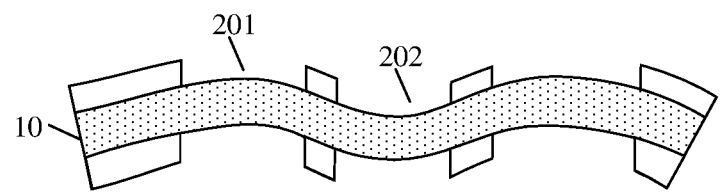

Next, referring to FIG. 5C to FIG. 5E, the portion of each of the first dielectric layer pre-layer 21' and the second dielectric layer pre-layer 22' in the first area is etched, to form the first groove 201. And/or, the portion of each of the first dielectric layer pre-layer 21' and the second dielectric layer pre-layer 22' in the second area is etched, to form a second groove 202.

Specifically, first, mask layers 30 may be grown on upper surfaces and lower surfaces of each of the first dielectric layer pre-layer 21' and the second dielectric layer pre-layer 22' respectively. Next, the mask layers 30 are patterned to form patterned mask layers 301, so as to show, on the mask layers 30, patterns of the first grooves and/or the second grooves to be etched. The mask layers 30 may be patterned by a photolithography process. The mask layers 30 may be photoresist masks or hard masks which are patterned based on photolithographic masks. When the mask layers 30 are the photoresist masks, the mask layers 30 are patterned specifically by operations of exposure, development and degumming, or the like. Next, the first groove 201 and/or the second groove 202 with a certain depth are etched according to the patterns of the first grooves and/or the second grooves to be etched.

Here, for example, the first groove 201 and/or the second groove 202 may be formed by using a wet or dry etching process.

Figure 5F:
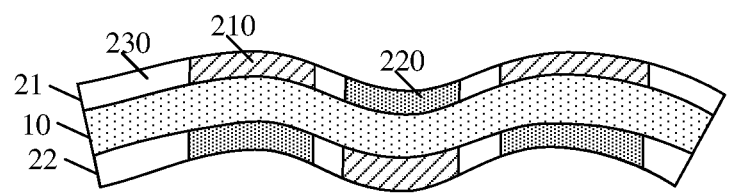

Next, referring to FIG. 5F, the first material is filled in the first groove 201, and CTE of the first material is greater than CTE of the material of the wafer 10; and/or, the second material is filled in the second groove 202, and CTE of the second material is less than CTE of the material of the wafer 10.

In an embodiment, the material of the first area 210 of each of the first dielectric layer 21 and the second dielectric layer 22 includes SiN or SiC. The material of the second area 220 of each of the first dielectric layer 21 and the second dielectric layer 22 includes quartz.

In an embodiment, CTE of the material of the first area 210 of each of the first dielectric layer 21 and the second dielectric layer 22 is greater than CTE of a material of the other area 230 of each of the first dielectric layer 21 and the second dielectric layer 22.

CTE of the material of the second area 220 of each of the first dielectric layer 21 and the second dielectric layer 22 is less than CTE of the material of the other area 230 of each of the first dielectric layer 21 and the second dielectric layer 22.

CTE of each of the first dielectric layer and the second dielectric layer at an externally-protruded area is greater than CTE of each of the first dielectric layer and the second dielectric layer at other areas; and CTE of each of the first dielectric layer and the second dielectric layer at an internally-recessed area is less than CTE at other areas. In this way, CTE of other areas is included between CTE of the first area and CTE of the second area, and other areas may also play a role of improving warpage degree of the wafer, such that the first dielectric layer and the second dielectric layer may play a role of improving warpage degree of the wafer better.

In an embodiment, as shown in FIG. 2A, thickness of the first area 210 of each of the first dielectric layer 21 and the second dielectric layer 22 is equal to or greater than thickness of the other area 230 of each of the first dielectric layer 21 and the second dielectric layer 22. Thickness of each of the first dielectric layer and the second dielectric layer at the first area is equal to or greater than thickness of each of the first dielectric layer and the second dielectric layer at other areas. In this way, each of the first dielectric layer and the second dielectric layer has a better heat expansion and cold contraction effect at this area, thereby better improving the problem of warpage of the wafer.

Specifically, in an embodiment, the thickness of the first area 210 of each of the first dielectric layer 21 and the second dielectric layer 22 is 1 to 4 times the thickness of the other area 230 of each of the first dielectric layer 21 and the second dielectric layer 22. Within the thickness range, each of the first dielectric layer and the second dielectric layer has a best effect of improving warpage degree of the wafer, to avoid no effect of improving warpage degree of the wafer due to too small thickness, and avoid excessively correcting the wafer and resulting in the wafer bending in a reverse direction, due to too large thickness.

In an embodiment, dielectric layer of the first area 210 includes multiple dielectric layers, and in the direction perpendicular to the surface of the wafer 10 and extending from the wafer 10 to the dielectric layer, CTE of a material of each of the dielectric layers of the first area 210 decreases stepwise.

In this way, a dielectric layer of the first area closest to the wafer has a maximum CTE, and has a larger CTE difference with respect to the wafer, such that warpage degree of the wafer may be better improved. Furthermore, since CTE of each of the dielectric layers away from the wafer decreases progressively, warpage degree of the wafer may be better adjusted, to avoid excessive correction.

Specifically, as shown in FIG. 2B, in the direction perpendicular to the surface of the wafer 10 and extending from the wafer 10 to the dielectric layer, the first area 210 includes a first sub-area 211 at a first layer and a first sub-area 212 at a second layer. CTEs of materials of the first sub-area 211 at the first layer and the first sub-area 212 at the second layer decrease stepwise.

Specifically, in some embodiments, CTEs of the first sub-area 211 at the first layer and the first sub-area 212 at the second layer may decrease stepwise by using materials with different CTEs. In some other embodiments, the first sub-area 211 at the first layer and the first sub-area 212 at the second layer may use the same material, but ions with different concentrations may be doped in each layer, so that CTEs of the first sub-area 211 at the first layer and the first sub-area 212 at the second layer decrease stepwise.

In an embodiment, dielectric layer of the second area 220 includes multiple dielectric layers, and in the direction perpendicular to the surface of the wafer 10 and extending from the wafer 10 to the dielectric layer, CTE of a material of each of the dielectric layers of the second area 220 increases stepwise.

In this way, a dielectric layer of the second area closest to the wafer has a minimum CTE, and has a larger CTE difference with respect to the wafer, such that warpage degree of the wafer may be better improved. Furthermore, since CTE of each of the dielectric layers away from the wafer increases progressively, warpage degree of the wafer may be better adjusted, to avoid excessive correction.

Specifically, as shown in FIG. 2B, in the direction perpendicular to the surface of the wafer 10 and extending from the wafer 10 to the dielectric layer, the second area 220 includes a second sub-area 221 at a first layer and a second sub-area 222 at a second layer. CTEs of materials of the second sub-area 221 at the first layer and the second sub-area 222 at the second layer increase stepwise.

Specifically, in some embodiments, CTEs of the second sub-area 221 at the first layer and the second sub-area 222 at the second layer may increase stepwise by using materials with different CTEs. In some other embodiments, the second sub-area 221 at the first layer and the second sub-area 222 at the second layer may use the same material, but ions with different concentrations may be doped in each layer, so that CTEs of the second sub-area 221 at the first layer and the second sub-area 222 at the second layer increase stepwise.

In some embodiments, the dielectric layer of the first area of the wafer warpage adjustment structure includes multiple dielectric layers, and the dielectric layer of the second area of the wafer warpage adjustment structure includes one dielectric layer. In some other embodiments, the dielectric layer of the first area includes one dielectric layer, and the dielectric layer of the second area includes multiple dielectric layers. In some other embodiments, as shown in FIG. 2B, the dielectric layer of the first area includes multiple dielectric layers, and the dielectric layer of the second area includes multiple dielectric layers.

In an embodiment, in a direction along which curvature of a curve corresponding to the protruded portion decreases, CTE of the material of the first area 210 of each of the dielectric layers decreases stepwise.

Specifically, as shown in FIG. 2C, in the direction along which curvature of a curve corresponding to the protruded portion decreases, the first area 210 includes a $1^{st}$ first sub-area 213, a $2^{nd}$ first sub-area 214 and a $3^{rd}$ first sub-area 215. CTEs of materials of the $1^{st}$ first sub-area 213, the $2^{nd}$ first sub-area 214 and the $3^{rd}$ first sub-area 215 decrease stepwise.

Because a place with a maximum curvature is more difficult to be corrected, the above problem may be effectively solved by using a dielectric layer with a largest CTE difference with respect to the wafer. Furthermore, CTEs of other dielectric layers vary with the curvature, such that warpage of the wafer may be accurately adjusted.

Specifically, in some embodiments, CTEs of the $1^{st}$ first sub-area 213, the $2^{nd}$ first sub-area 214 and the $3^{rd}$ first sub-area 215 may decrease stepwise by using materials with different CTEs. In some other embodiments, the $1^{st}$ first sub-area 213, the $2^{nd}$ first sub-area 214 and the $3^{rd}$ first sub-area 215 may use the same material, but ions with different concentrations may be doped in each area, so that CTEs of the $1^{st}$ first sub-area 213, the $2^{nd}$ first sub-area 214 and the $3^{rd}$ first sub-area 215 decrease stepwise.

In an embodiment, in a direction along which curvature of a curve corresponding to the recessed portion decreases, CTE of the material of the second area 220 of each of the dielectric layers increases stepwise.

Specifically, as shown in FIG. 2C, in the direction along which curvature of a curve corresponding to the recessed portion decreases, the second area 220 includes a $1^{st}$ second sub-area 223, a $2^{nd}$ second sub-area 224 and a $3^{rd}$ second sub-area 225. CTEs of materials of the $1^{st}$ second sub-area 223, the $2^{nd}$ second sub-area 224 and the $3^{rd}$ second sub-area 225 increase stepwise.

Because a place with a maximum curvature is more difficult to be corrected, the above problem may be effectively solved by using a dielectric layer with a largest CTE difference with respect to the wafer. Furthermore, CTEs of other dielectric layers vary with the curvature, such that warpage of the wafer may be accurately adjusted.

Specifically, in some embodiments, CTEs of the $1^{st}$ second sub-area 223, the $2^{nd}$ second sub-area 224 and the $3^{rd}$ second sub-area 225 may increase stepwise by using materials with different CTEs. In some other embodiments, the $1^{st}$ second sub-area 223, the $2^{nd}$ second sub-area 224 and the $3^{rd}$ second sub-area 225 may use the same material, but ions with different concentrations may be doped in each area, so that CTEs of the $1^{st}$ second sub-area 223, the $2^{nd}$ second sub-area 224 and the $3^{rd}$ second sub-area 225 increase stepwise.

In some embodiments, in the direction along which curvature of a curve corresponding to the protruded portion decreases, CTE of the material of the first area decreases stepwise, and in the direction along which curvature of a curve corresponding to the recessed portion decreases, CTE of the material of the second area keeps unchanged. In some other embodiments, in the direction along which curvature of a curve corresponding to the protruded portion decreases, CTE of the material of the first area keeps unchanged, and in the direction along which curvature of a curve corresponding to the recessed portion decreases, CTE of the material of the second area increases stepwise. In some other embodiments, as shown in FIG. 3C, in the direction along which curvature of a curve corresponding to the protruded portion decreases, CTE of the material of the first area decreases stepwise, and in the direction along which curvature of a curve corresponding to the recessed portion decreases, CTE of the material of the second area increases stepwise.

In an embodiment, the warpage area of the wafer has a saddle-like shape or a wavy shape.

Figure 2D:
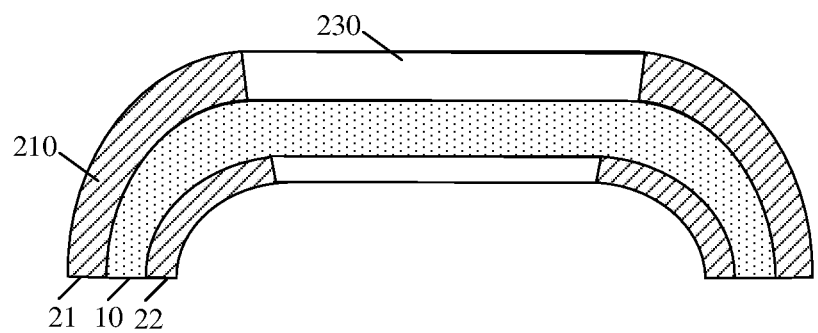
Figure 2E:
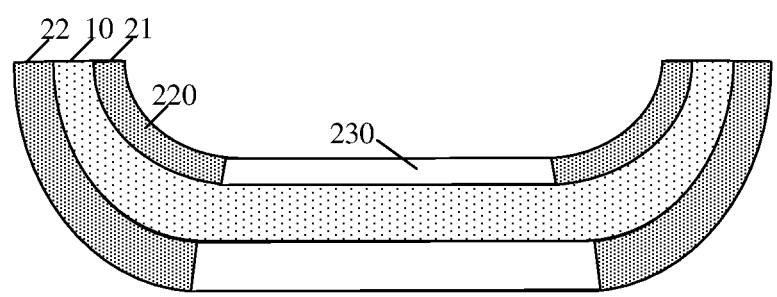

Specifically, in some embodiments, as shown in FIG. 5F, the bending shape of the wafer is a wavy shape. In some other embodiments, as shown in FIG. 2D and FIG. 2E, the bending shape of the wafer is a saddle-like shape. As shown in FIG. 2D, each of the first dielectric layer 21 and the second dielectric layer 22 only includes the first area 210. As shown in FIG. 2E, each of the first dielectric layer 21 and the second dielectric layer 22 only includes the second area 220.

The above descriptions are only preferred embodiments of the disclosure, and are not intended to limit the scope of protection of the disclosure. Any modification, equivalent replacement, improvement, or the like made within the spirit and principle of the disclosure should be included within the scope of protection of the disclosure.

The invention claimed is:

1. A wafer warpage adjustment structure, comprising:
    a wafer comprising a lower surface, and an upper surface arranged opposite to the lower surface and configured to form a semiconductor device;
    a first dielectric layer located on the upper surface of the wafer; and
    a second dielectric layer located on the lower surface of the wafer,
    wherein each of the first dielectric layer and the second dielectric layer comprises at least a first area or a second area, and further comprises other areas other than at least the first area or the second area;
    the first area covers a protruded portion of the wafer which is protruded under an independent state in a direction perpendicular to the surface of the wafer and extending from the wafer to the dielectric layer, and the second area covers a recessed portion of the wafer which is recessed under an independent state in the direction perpendicular to the surface of the wafer and extending from the wafer to the dielectric layer; and
    Coefficient of Thermal Expansion (CTE) of a material of the first area is greater than CTE of a material of the wafer, and CTE of a material of the second area is less than CTE of the material of the wafer.

2. The wafer warpage adjustment structure of claim 1, wherein
    the material of the first area of each of the first dielectric layer and the second dielectric layer comprises silicon nitride (SiN) or silicon carbide (SiC); and
    the material of the second area of each of the first dielectric layer and the second dielectric layer comprises quartz.

3. The wafer warpage adjustment structure of claim 1, wherein
    CTE of the material of the first area of each of the first dielectric layer and the second dielectric layer is greater than CTE of a material of the other area of each of the first dielectric layer and the second dielectric layer; and
    CTE of the material of the second area of each of the first dielectric layer and the second dielectric layer is less than CTE of the material of the other area of each of the first dielectric layer and the second dielectric layer.

4. The wafer warpage adjustment structure of claim 1, wherein
    thickness of the first area of each of the first dielectric layer and the second dielectric layer is equal to or greater than thickness of the other area of each of the first dielectric layer and the second dielectric layer.

5. The wafer warpage adjustment structure of claim 4, wherein
    the thickness of the first area of each of the first dielectric layer and the second dielectric layer is 1 to 4 times the thickness of the other area of each of the first dielectric layer and the second dielectric layer.

6. The wafer warpage adjustment structure of claim 1, wherein
    dielectric layer of the first area comprises a plurality of dielectric layers, and in the direction perpendicular to the surface of the wafer and extending from the wafer to the dielectric layer, CTE of a material of each of the dielectric layers of the first area decreases stepwise.

7. The wafer warpage adjustment structure of claim 1, wherein
    dielectric layer of the second area comprises a plurality of dielectric layers, and in the direction perpendicular to the surface of the wafer and extending from the wafer to the dielectric layer, CTE of a material of each of the dielectric layers of the second area increases stepwise.

8. The wafer warpage adjustment structure of claim 1, wherein
    in a direction along which curvature of a curve corresponding to the protruded portion decreases, CTE of the material of the first area of each of the dielectric layers decreases stepwise.

9. The wafer warpage adjustment structure of claim 1, wherein
    in a direction along which curvature of a curve corresponding to the recessed portion decreases, CTE of the material of the second area of each of the dielectric layers increases stepwise.

10. A method for manufacturing a wafer warpage adjustment structure, comprising:
    providing a wafer comprising a lower surface, an upper surface arranged opposite to the lower surface and configured to form a semiconductor device, and a warpage area;
    forming a first dielectric layer on the upper surface of the wafer; and
    forming a second dielectric layer on the lower surface of the wafer,
    wherein each of the first dielectric layer and the second dielectric layer comprises at least a first area or a second area, and further comprises other areas other than at least the first area or the second area;
    the first area covers a protruded portion of the warpage area of the wafer which is protruded in a direction perpendicular to the surface of the wafer and extending from the wafer to the dielectric layer, and the second area covers a recessed portion of the warpage area of the wafer which is recessed in the direction perpendicular to the surface of the wafer and extending from the wafer to the dielectric layer; and
    Coefficient of Thermal Expansion (CTE) of a material of the first area is greater than CTE of a material of the wafer, and CTE of a material of the second area is less than CTE of the material of the wafer.

11. The method of claim 10, wherein
    the material of the first area of each of the first dielectric layer and the second dielectric layer comprises silicon nitride (SiN) or silicon carbide (SiC); and
    the material of the second area of each of the first dielectric layer and the second dielectric layer comprises quartz.

12. The method of claim 10, wherein
    CTE of the material of the first area of each of the first dielectric layer and the second dielectric layer is greater than CTE of a material of the other area of each of the first dielectric layer and the second dielectric layer; and
    CTE of the material of the second area of each of the first dielectric layer and the second dielectric layer is less than CTE of the material of the other area of each of the first dielectric layer and the second dielectric layer.

13. The method of claim 10, wherein
forming the first dielectric layer on the upper surface of the wafer, and forming the second dielectric layer on the lower surface of the wafer comprises:
forming a first dielectric layer pre-layer on the upper surface of the wafer;
forming a second dielectric layer pre-layer on the lower surface of the wafer; and
performing at least one of:
etching a portion of each of the first dielectric layer pre-layer and the second dielectric layer pre-layer in the first area, to form a first groove, and filling the first groove with a first material of which CTE is greater than CTE of the material of the wafer; or
etching a portion of each of the first dielectric layer pre-layer and the second dielectric layer pre-layer in the second area, to form a second groove, and filling the second groove with a second material of which CTE is less than CTE of the material of the wafer.

14. The method of claim 10, wherein
thickness of the first area of each of the first dielectric layer and the second dielectric layer is equal to or greater than thickness of the other area of each of the first dielectric layer and the second dielectric layer.

15. The method of claim 14, wherein
the thickness of the first area of each of the first dielectric layer and the second dielectric layer is 1 to 4 times the thickness of the other area of each of the first dielectric layer and the second dielectric layer.

16. The method of claim 10, wherein
dielectric layer of the first area comprises a plurality of dielectric layers, and in the direction perpendicular to the surface of the wafer and extending from the wafer to the dielectric layer, CTE of a material of each of the dielectric layers of the first area decreases stepwise.

17. The method of claim 10, wherein
dielectric layer of the second area comprises a plurality of dielectric layers, and in the direction perpendicular to the surface of the wafer and extending from the wafer to the dielectric layer, CTE of a material of each of the dielectric layers of the second area increases stepwise.

18. The method of claim 10, wherein
in a direction along which curvature of a curve corresponding to the protruded portion decreases, CTE of the material of the first area of each of the dielectric layers decreases stepwise.

19. The method of claim 10, wherein
in a direction along which curvature of a curve corresponding to the recessed portion decreases, CTE of the material of the second area of each of the dielectric layers increases stepwise.

20. The method of claim 10, wherein
the warpage area of the wafer has a saddle-like shape or a wavy shape.

* * * * *